US006526362B2

(12) United States Patent
Jones et al.

(10) Patent No.: US 6,526,362 B2
(45) Date of Patent: Feb. 25, 2003

(54) NETWORK DIAGNOSTIC METER

(75) Inventors: Nicolas D. L. Jones, Kitchener (CA); Steven R. Montgomery, Guelph (CA); Robert Graham, Vancouver (CA)

(73) Assignee: Woodhead Industries, Inc., Deerfield, IL (US)

( * ) Notice: Subject to any disclaimer, the term of this patent is extended or adjusted under 35 U.S.C. 154(b) by 0 days.

(21) Appl. No.: 09/990,448

(22) Filed: Nov. 9, 2001

(65) Prior Publication Data

US 2002/0059040 A1 May 16, 2002

Related U.S. Application Data

(60) Provisional application No. 60/287,528, filed on Apr. 30, 2001, and provisional application No. 60/248,046, filed on Nov. 13, 2000.

(51) Int. Cl.[7] .............................................. G06F 17/40
(52) U.S. Cl. ....................................... 702/82; 702/122
(58) Field of Search ................ 702/118–123, 189–193, 702/64–66, 71–73, 81, 82

(56) References Cited

U.S. PATENT DOCUMENTS

| | | | | |
|---|---|---|---|---|
| 5,121,342 A | * | 6/1992 | Szymborski et al. | 375/225 |
| 5,946,301 A | * | 8/1999 | Swanson et al. | 370/252 |
| 5,974,569 A | * | 10/1999 | Nickles | 714/38 |
| 5,996,518 A | * | 12/1999 | Tomita | 112/470.01 |
| 6,009,406 A | * | 12/1999 | Nick | 705/10 |
| 6,381,269 B1 | * | 4/2002 | Gradl et al. | 375/224 |

OTHER PUBLICATIONS

Synergetic Internet advertizement. www.synergetic.com/detective/versions.htm, Synergetic Micro Systems, unattributed, May 2002.*
DeviceNet Troubleshooting Tips, how to find common DeviceNet Problems fast with the Devicenet Detective. pp 1–7, Factory Comm LLC www.factorycomm.com/tips/index.htm unattributed, May 2002.*
FactoryComm Internet advertisement. Synergetic MicorSystems "DeviceNet Detective" unattributed, May 2002.*
Internet advertisement FactoryComm. FactoryComm unattributed www.factorycomm.com, May 2002.*

* cited by examiner

*Primary Examiner*—Marc S. Hoff
*Assistant Examiner*—Craig S Miller
(74) *Attorney, Agent, or Firm*—Emrich & Dithmar

(57) ABSTRACT

A portable test meter is disclosed for measuring, calculating, recording and monitoring significant system parameters for a local communication network of the type used in industrial automation applications. The meter is disclosed in the context of a network employing the DeviceNet protocol. For each network parameter of interest, a rotary switch selects a desired one for display. An auto search mode selectable by the operator, increments through selected network parameters and compares measured or calculated values against stored data representing acceptable, marginal, or unacceptable conditions, and an associated visual indicia is displayed for each unacceptable or margin condition detected.

17 Claims, 10 Drawing Sheets

NETWORK DIAGNOSTIC METER

RELATED APPLICATION

This application is a non-provisional application claiming the benefit of the filing date of now abandoned U.S. Provisional Applications No. 60/248,046 filed Nov. 13, 2000 and No. 60/287,528 filed Apr. 30, 2001.

FIELD OF THE INVENTION

The present invention relates to industrial communication networks; and more particularly, it relates to a diagnostic test system for performing a wide range of diagnostic tests in situ on an industrial communication network using a hand-held meter of convenience size.

BACKGROUND OF THE INVENTION

Industrial automation installations have used programmable logic controllers (PLCs) in combination with a variety of individual devices, such as presses, robots, visual displays, solenoid actuators and many others, for achieving efficient information communication and control in manufacturing environments. A communication network employing its own protocol and signal specifications is typically used to interface all of the various devices required to be connected together. One network protocol has grown to become the current leading device-level network standard for industrial automation. That is the DeviceNet protocol. Thus, the present invention, though not so limited, is disclosed in the context of such a network.

As with any network, there is a need to test the network during original installation and, later, during normal preventive maintenance as well as when faults occur to ensure proper operation. Some network analysis tools simply establish continuity and perform no diagnostic measurements of active devices normally operated on the system nor of the signal levels or data streams typically employed in the system. Such tools are of limited use in the complex networks of modern industrial automation systems.

Networks of this type, considering the physical connections, the nature of the various types of devices which may be employed, including PLCs and personal computers and display devices, as well as the signal protocols, can be very difficult to diagnose when a problem arises. Obviously, in the case of a system which is operating a production line, if a problem arises, there is a need to identify immediately and correct the problem. Because of the different layers of physical and electronic systems employed, the skill level of a person adequate to perform diagnostic routines at all levels has become quite high. Yet, it is not economical to have a specialized person of such a high skill level simply waiting until a fault occurs because, despite the occurrence of occasional faults, the systems are quite reliable.

It is much more economical to have the initial measuring or testing of the network conducted by maintenance personnel normally in the manufacturing area on a regular basis, such as electricians, and to provide such personnel with simple, easy-to-use and readily understandable equipment which is economical to purchase, and may be assembled rapidly to the troubled network without the need to shut the system down.

SUMMARY OF THE INVENTION

The present invention addresses the problem of providing an economical test meter having the capability of performing test and diagnostic measures on an industrial automation communication network in situ by personnel having the training at the level of an electrician or the like, rather than an electronic engineer or network specialist. Depending upon the nature of the apparent problem, the on-site personnel may then correct the problem or consult an engineer or other specialist having further expertise in the area. In addition, the present invention enables the technician or operator to store (or "freeze") data recorded during his or her diagnostic test procedures on the network for subsequent use or subsequent analysis.

The invention is provided in the form of a meter in a housing sized to fit comfortably in one hand of a user, leaving the other hand free to rotate a switch to the various test positions. A connector is provided for coupling the device to the network under study. Signal lines couple the data signals as well as the bus power supply voltage ("Vbus") and the voltage of the shield lead ("Vshield") to signal conditioning circuitry.

A display (liquid crystal display, or LCD in the illustrated embodiment) is included. The display is operated by an interface data processor coupled to the main data processor (simply "processor") by means of a bus. Additional memory is provided for the main processor.

As used herein, a "network" includes a series of devices, such as computers, programmable logic controllers, displays, sensors, control elements or the like, commonly used in industrial automation systems. A "node" is any such device connected to the network, including, for example, the test device of the present invention. According to DeviceNet protocol (an industrial communication protocol standard based on the CAN or Controller Area Network, protocol standard), there are two data signal lines, one designated as the CAN High or "CANH" line and the other is designated CAN Low or "CANL", according to convention. The system of the present invention employs a main processor receiving the incoming data signals and sampling those signals for an accurate determination of amplitude which is then converted to a corresponding digital signal representation and stored in memory to establish a database of recorded signal measurements for various network signal parameters, to be described. The operator uses the rotary switch to access data stored in the main processor memory and to display that data.

The present system provides a wide range of diagnostic information, disclosed in more detail within. By way of example, two switch positions (positions 10 and 11 in the illustrated embodiment) may be selected by the operator to display the CANL voltage for the recessive bit (switch position 10), and for the dominant bit (position 11) of the signal. As each measurement for a given data frame is made, the system stores a "live" value, a maximum value and a minimum value for both the CANH and CANL signals, for the dominant bit and the recessive bit. These values in the illustrated embodiment are not associated with a specific node, although the invention is not so limited because the data identifying the node is available to the processor, if desired. The "live" values are overwritten in memory so that only the most current signals are retained in memory. However, the maximum and minimum values are replaced only if the previously stored values are exceeded (in absolute value).

The main processor also computes a signal value referred to as the Relative Node Common Voltage from the recorded database and then determines the worst-case (i.e., maximum) difference between any two Relative Node Common Voltages for the system under test. This difference is defined as the network Common Mode Voltage; and it is deemed to be a significant factor in determining whether the network is acceptable, marginal or unacceptable in its operation. The network Common Mode Voltage is also displayed upon the operator's election (switch position 5).

Switch positions display the differential instantaneous voltage between CANH and CANL. The main processor subtracts the CANL voltage from the CANH voltage, and the system displays the differential voltage for the dominant bit (rotary switch position 7) and the recessive bit (rotary switch position 6). Again, live MAX and MIN values are stored and may be displayed by the operator. The system computes and displays the Common Mode Voltage measured by the system in switch position 5.

These measurements have been found to provide substantial information to the user in isolating and diagnostic network problems. Of particular significance is the fact that the main processor stores predetermined limits for ranges of acceptance for each of the conditions being measured and divides or groups the ranges of potential measurements into "acceptable," meaning that the parameter being measured and displayed is within normal operating ranges, "marginal," meaning that the particular parameter being measured and displayed is acceptable but not within the desired range, or "unacceptable," meaning that the value is outside operating specifications. Each of these three conditions is indicated by actuating a graphic representation of the condition which, in the illustrated embodiment, takes the form of a "happy" face indicating acceptable operating conditions, a "neutral" face indicating marginal conditions or a "sad" face indicating unacceptable conditions.

Other positions on the rotary switch display measurements of bus power voltage, bus data traffic, bus errors and shield voltage, as will be discussed further below.

Other features and advantages of the present invention will be apparent to persons skilled in the art from the following detailed disclosure of the exemplary embodiment accompanied by the attached drawing wherein identical reference numerals will refer to like parts in the various views.

DETAILED DESCRIPTION OF THE ILLUSTRATED EMBODIMENT

Figure 1:
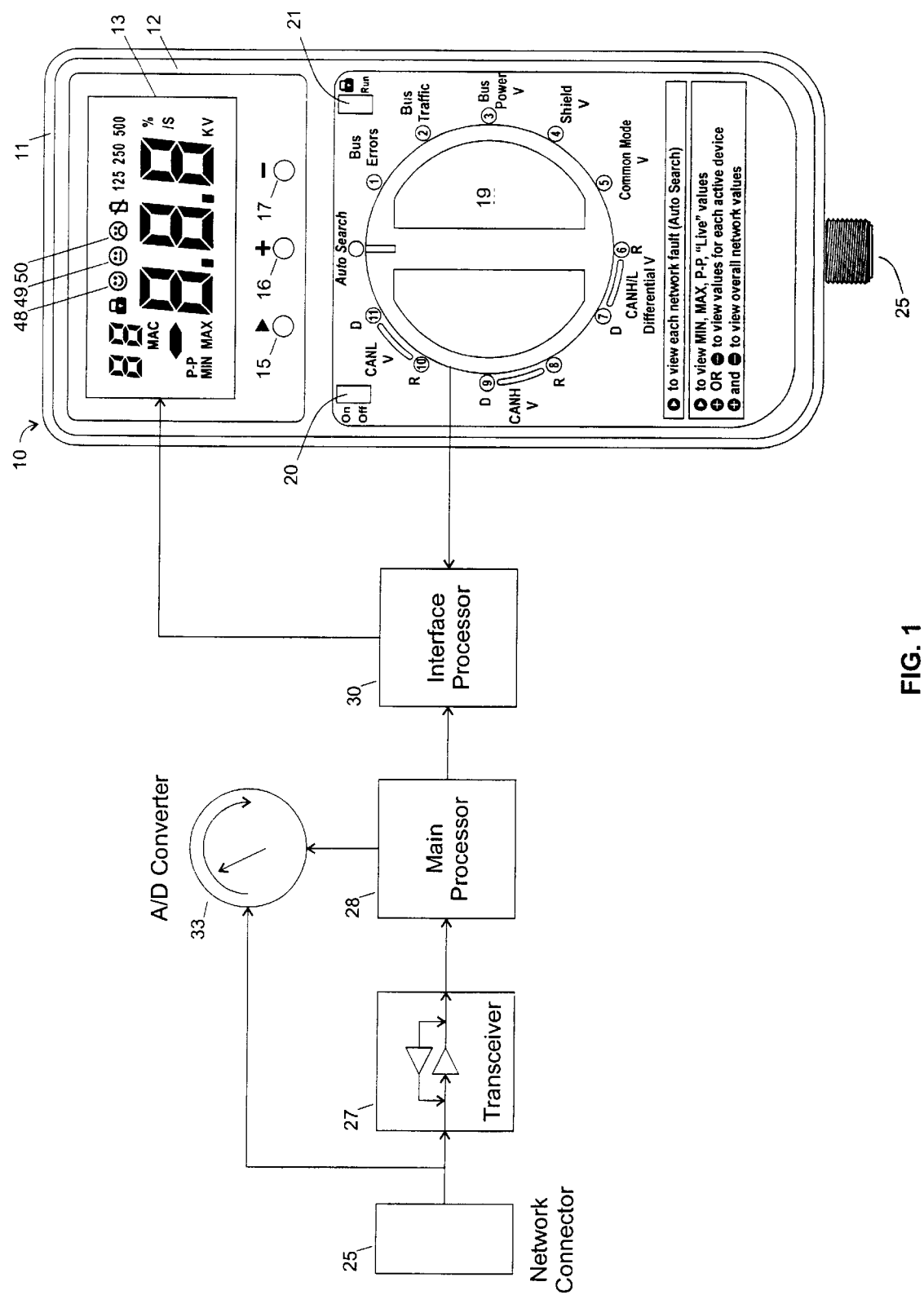
FIG. 1 is a diagram, partly in functional block form, incorporating the present invention.

Turning first to FIG. 1, reference numeral 10 generally designates a diagnostic meter for a communication network of the type used in industrial automation applications. The meter 10 includes a casing 11, preferably made of rubber or other moldable protective, elastomeric material for both buffering any force due to a fall, in the event the instrument is dropped, and for providing protection against water, oils and other liquids. On the face 12 of the housing 11, there is a display 13. Beneath display 13 are three push buttons for actuating associated switches. These are referred to respectively as the "Advancing" or incrementing switch 15, the "Plus" switch 16 and the "Minus" switch 17, and they will be further described below. Beneath the display 13 and the switches 15–17 is a rotary switch 19 which is itself of conventional design and has twelve individual stations, designated respectively 1–11 and "Auto Search" at the twelve o'clock (top) position. Although a rotary switch is shown and preferred, persons skilled in the art will appreciate that other switch types or combinations for selecting positions or stations may also be employed.

The meter also includes a toggle switch 20 for turning the meter on and off, and a second toggle switch 21 for placing the system either in a "Run" mode or a "Lock" mode, to be further described below. At the bottom of housing 11 is a threaded nipple electrical connector 23 for receiving a cable connected to the network under test.

Turning now to the left side of FIG. 1, reference numeral 25 designates a connector corresponding to the threaded connector 23 of the housing, which may be connected to a test cable. Output lines and signals from the network are coupled through the connector 25 to a conventional transceiver 27, the output of which feeds a main data processor 28 (or simply "processor"). The main processor 28 communicates with a second processor referred to as the "interface" processor and designated by reference numeral 30. Persons skilled in the art will appreciate that although two processors are shown in this embodiment, one data processor of sufficient capacity and storage could be employed. Further, if it is not necessary to display the data measured, the interface processor may be unnecessary. The rotary switch 19 of the meter 10 feeds a signal to the interface processor 30 to indicate what information stored in the system, the operator of the meter wishes to display. The interface processor 30 receives digital signals from the database of the main processor 28, where the data is stored.

Figure 4:
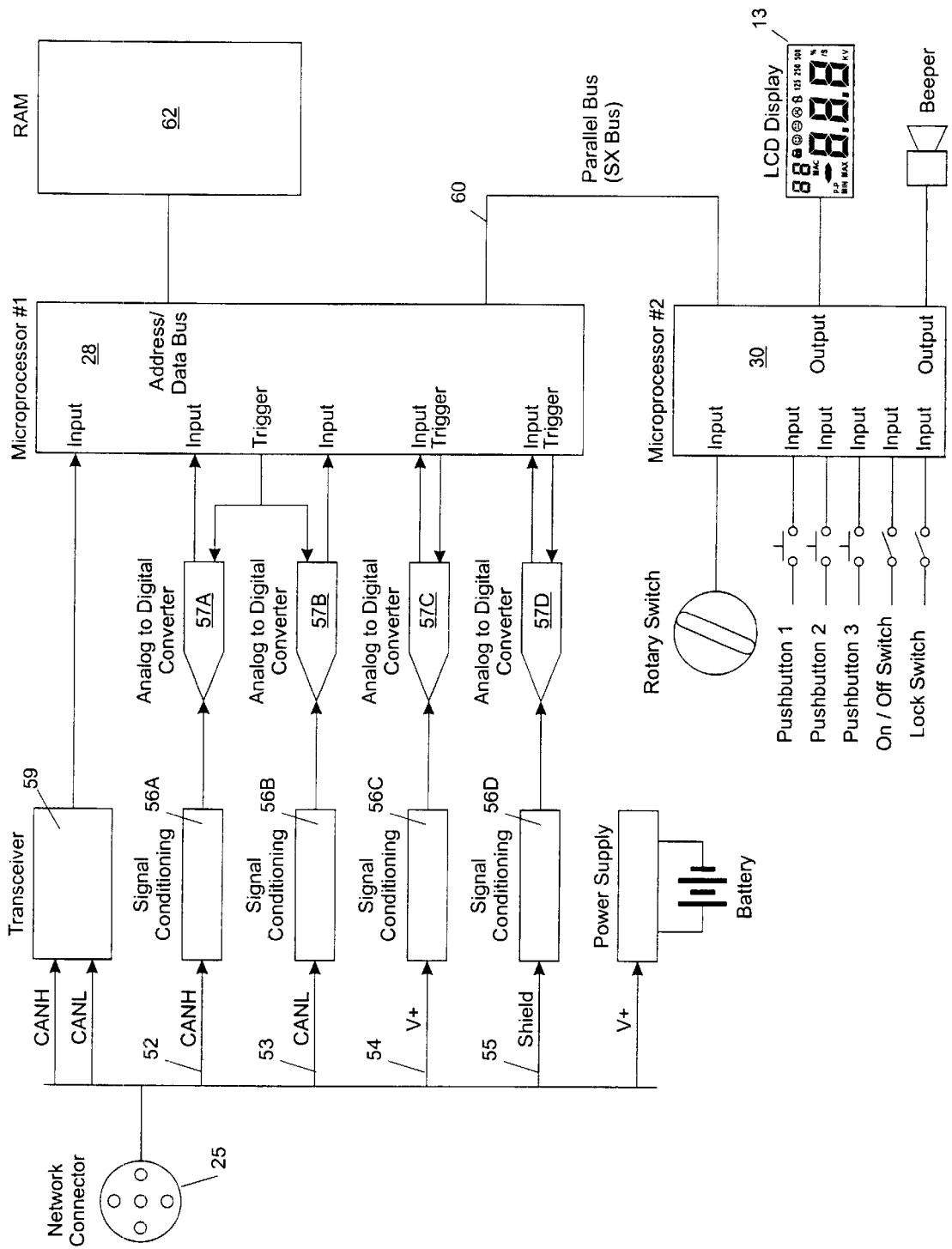
FIG. 4 is a more detailed, functional block diagram of the system.

Turning now to FIG. 4, there is shown a more detailed functional block diagram of the system. The network connector is again identified by reference numeral 25, and it includes separate lines designated 52, 53, 54 and 55 for the CANH voltage, CANL voltage, Vbus voltage, and Vshield voltage respectively. Each of these lines is coupled to conventional signal conditioning circuitry included within the blocks 56A–56D respectively. The signal conditioning circuits have their analog outputs converted respectively by analog-to-digital converters 57A–57D. Separately, the CANH and CANL lines are also connected to the input of a conventional transceiver 59. The output of the transceiver 59, and the four analog-to-digital converters 57A–57D (representative respectively of the CANH, CANL, Vbus and Vshield signals, in their associated digital representations), are coupled to the main data processor, again designated 28 which is coupled to the interface processor by means of a parallel bus 60. Associated with the main processor 28 is a section of random access memory schematically designated at 62; and as already indicated, the interface processor 30 drives the LCD display 13.

For each signal appearing on a data line, as well as for the bus voltage 54 and the shield voltage 55, the main processor controls the sample timing (described in further detail below) taken by the analog-to-digital converter associated with each of the lines, and that signal is stored (copied) in the database compiled in RAM 62. For each of the CANH and CANL signals, both dominant and recessive bits, three separate values are stored or copied, as described further below.

Figure 5:
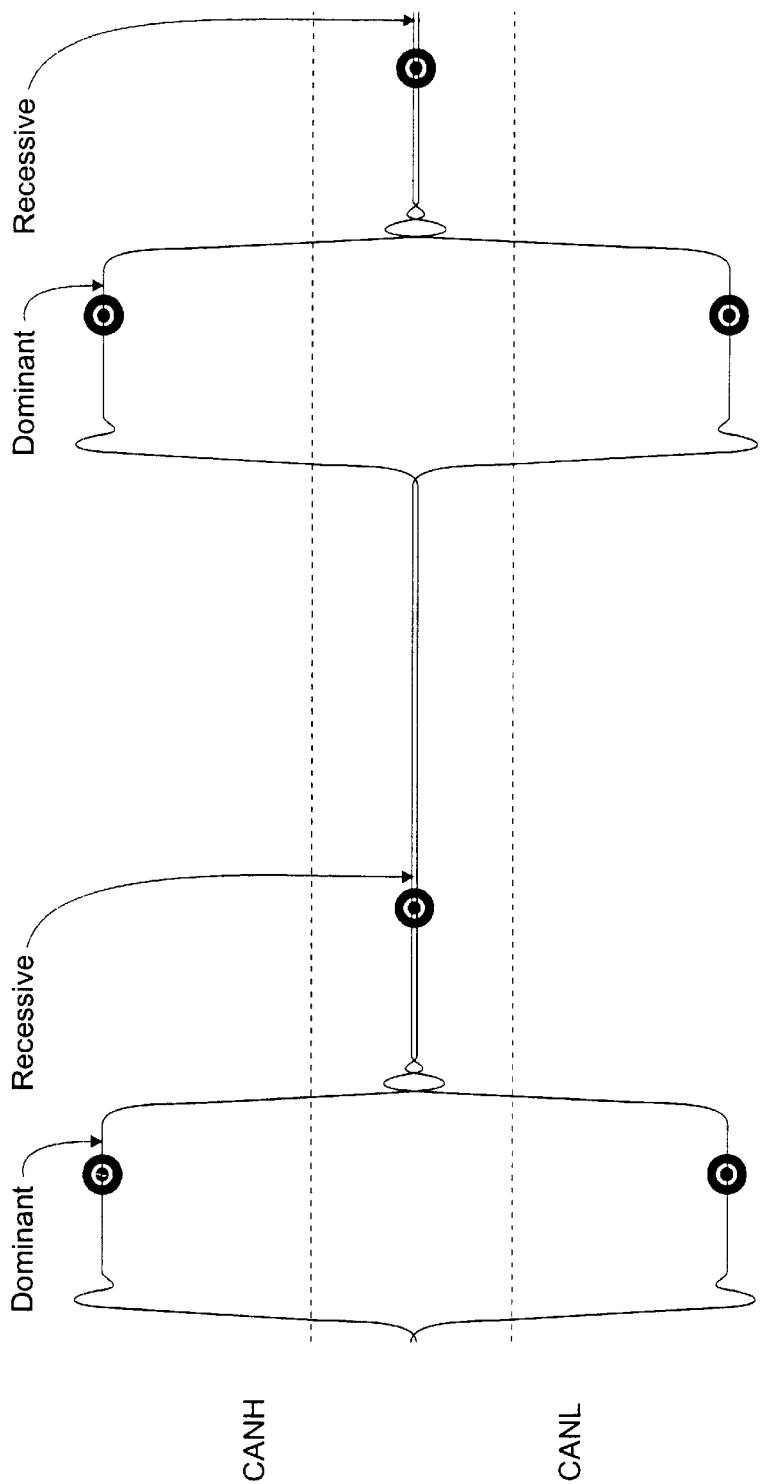
FIG. 5 is diagram illustrating an idealized voltage of the dominant and recessive bit signals on the CANH and CANL wires.

By way of explanation, FIG. 5, shows idealized voltage waveforms for the CANH line (shown in dotted line) and the CANL line (shown in solid line). Also shown and illustrated by a "bulls-eye" symbol are times for each of the respective bits at which a sample is taken by the associated analog-to-digital converter as illustrated in FIG. 1. This is the normal CAN sampling point for DeviceNet networks, and measures the actual voltage applied to a CAN transceiver at the instant the CAN MAC (media access controller) is defining the bus state through sampling. The bus voltage is sampled at the normal CAN sampling point measuring the actual voltage at the input of the CAN transceiver at the instant the CAN MAC is determining the bus state. This is in contradistinction from some diagnostic techniques which measure the average signal voltage (e.g., by analog filter). Network traffic affects the results in this technique because of the varying relationship over time of dominant to recessive bits. It has been found that by sampling the dominant and recessive bits on the CANH and CANL lines at these sample times, an accurate representation of the amplitude of the associated signals, particularly as perceived by the transceivers at nodes in the network, enhances the overall measurement accuracy of the network. The CAN protocol defines a bus access arbitration method that results in the possibility of multiple nodes transmitting concurrent dominant bits during the start of a communication, it has been found that sampling the dominant bit on the CANH and CANL lines during the latter part of a communication where only one node may be transmitting is desirable to avoid inaccuracies in representation of amplitude of the associated signals. In the case of DeviceNet, it is preferred to sample a dominant bit which occurs after the part of a communication where multiple stations may be concurrently transmitting dominant bits. This may be achieved by sampling the RTR bit in each CAN frame. Differential voltages (i.e., the difference between the CANH and CANL signals levels) which are greater than the amount defined by the dashed lines in FIG. 5 are deemed by the transceivers as being dominant bits; and differential voltages which are less than this amount (i.e., falling within the range defined by the dashed lines) are deemed to be recessive bits.

Figure 6:
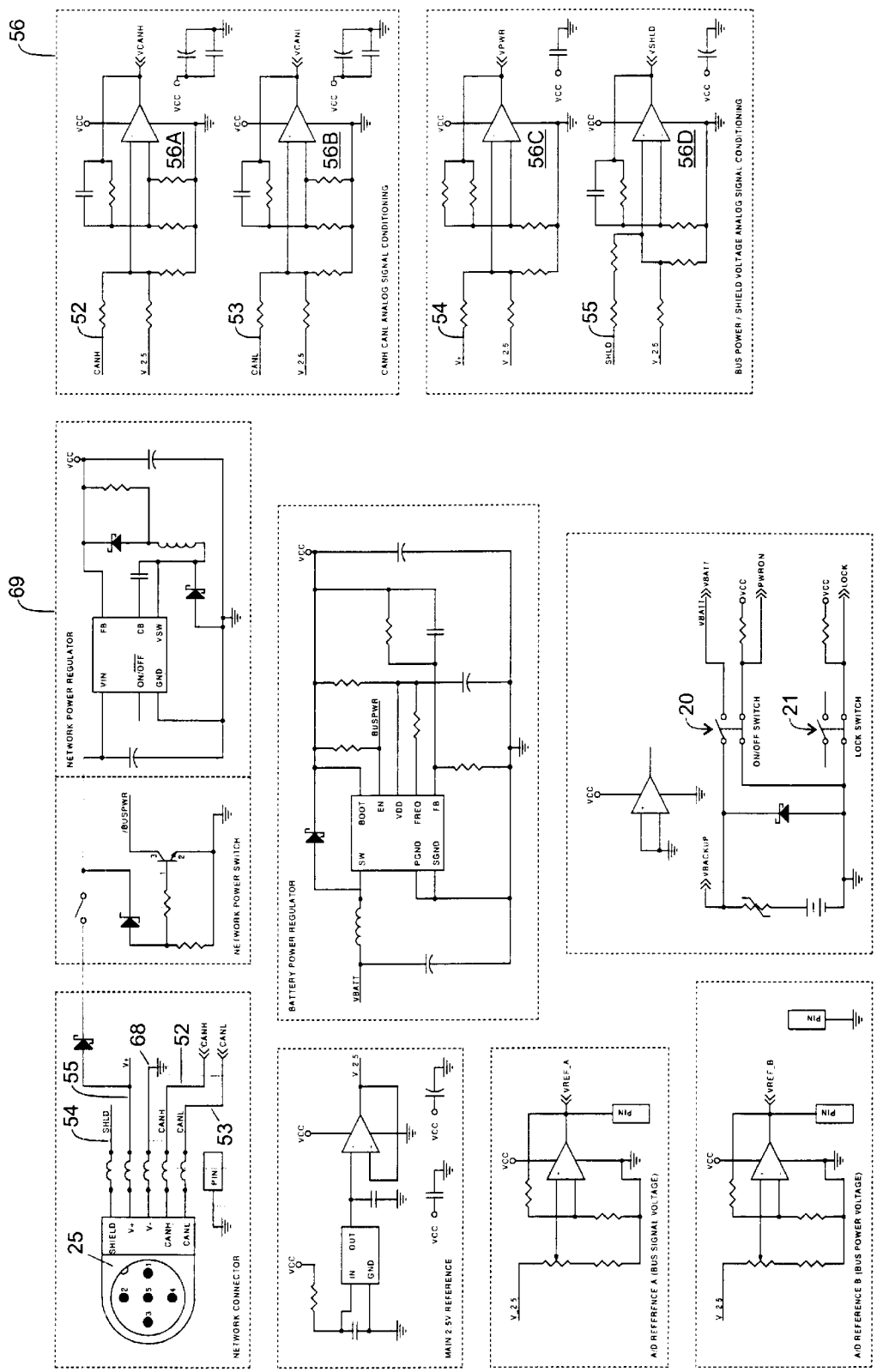
FIGS. 6–8 are more detailed schematic diagrams of the circuitry.
Figure 7:
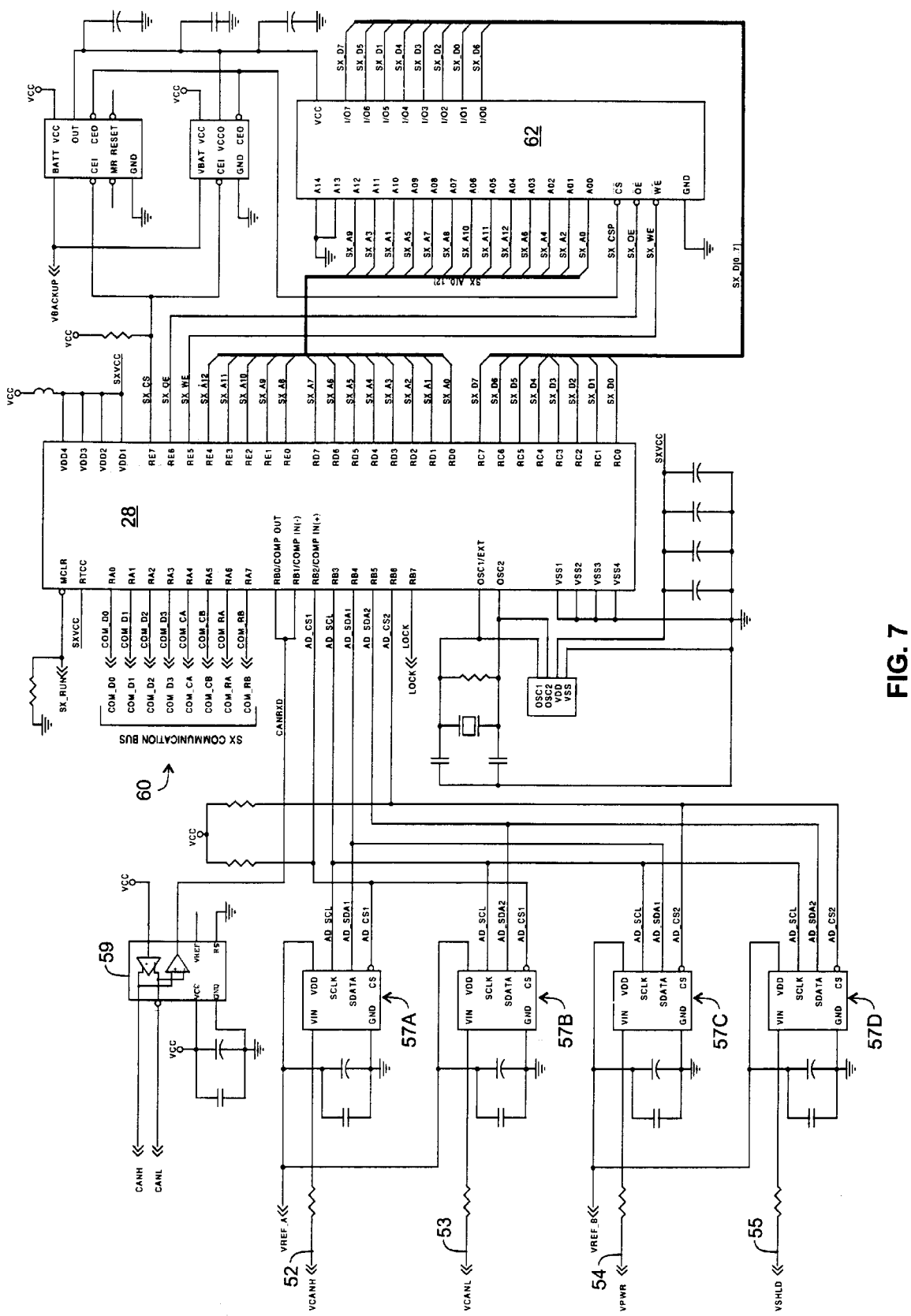
Figure 8:
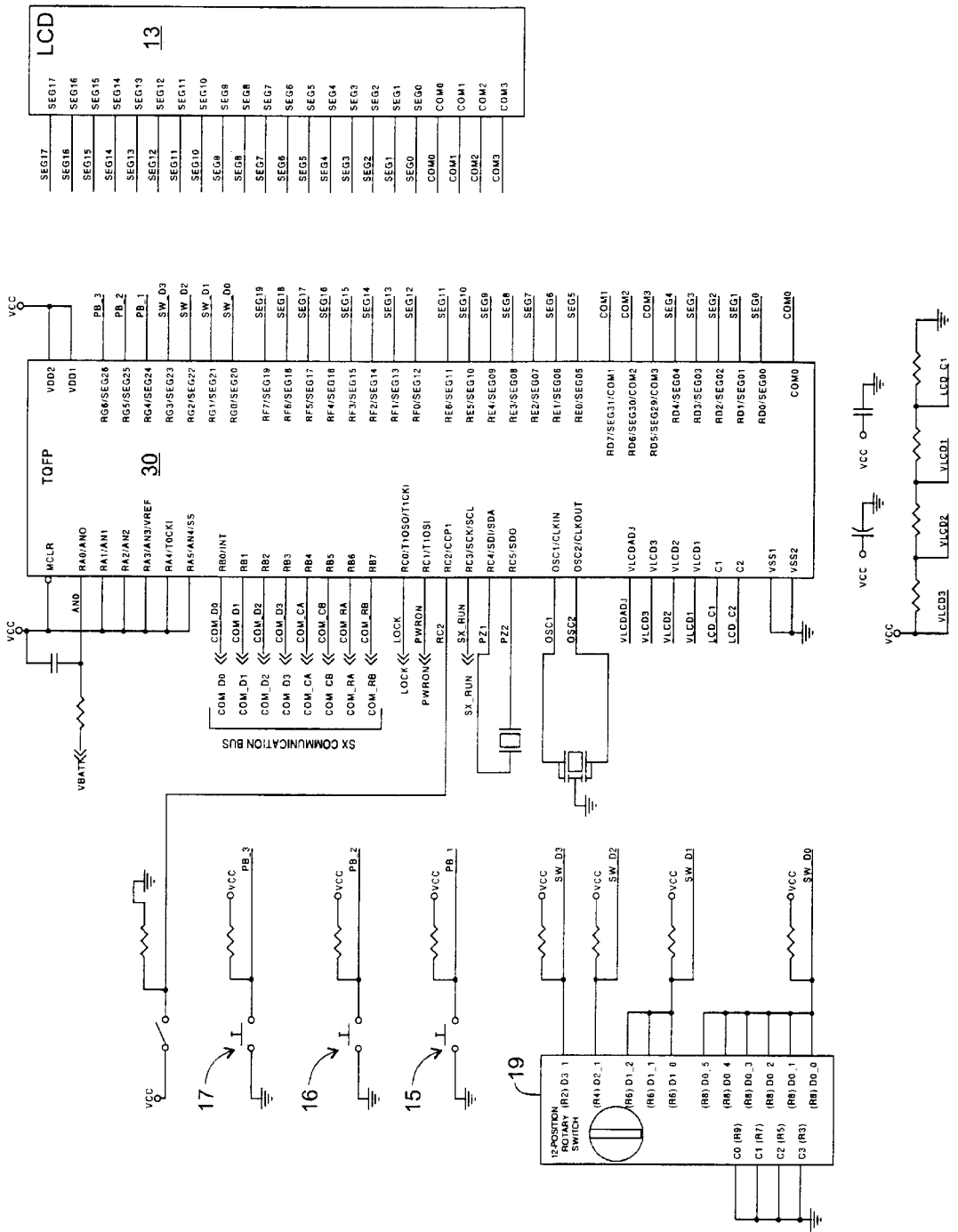

Turning now to FIGS. 6–8, there is shown a still more detailed schematic of the system. Referring first to FIG. 6, in the upper left hand corner, there is shown a circuit schematic diagram of the network connector 25, together with the leads 52 and 53 carrying the CANH and CANL signals which are also connected to their associated signal conditioning circuitry designated generally 56A and 56B in FIG. 6. The outputs of the signal conditioning circuitry 56A, 56B are connected to analog-to-digital converters 57A, 57B, in FIG. 7.

The analog signal conditioning circuitry for the bus power 56C, shield voltage 56D and CANH/CANL signals are conventional and may be the same for each signal. Returning to the connector 25, the shield lead is designated 54, the Vplus lead is designated 55, and the ground lead is designated 68. Leads 54 and 55 are connected to the input of their associated signal conditioning circuits 56C, 56D shown within the block 57 in FIG. 6. The Vplus signal is also connected to the network power switch 20 and through a conventional power regulator 69 for supplying the various required voltage levels for system power. In the lower central portion of FIG. 6, there is shown a previously described on/off switch generally designated 20 and the lock switch at 21 shown in their mechanical counterparts in FIG. 1. These switches generate signals designated respectively PWRON and LOCK which are connected to the similarly designated inputs respectively at pins 16 and 17 of the interface data processor 30 in FIG. 8.

Referring now to FIG. 7, the output signals of the signal conditioning circuitry of FIG. 6 which shape the signals for Vplus 54 and Vshield 55 are coupled respectively to the analog-to-digital converters 57C and 57D in FIG. 7, which are connected to the main data processor 28.

The CANH and CANL signal lines are coupled to the data processor 28 via transceiver 59, previously described in connection with FIG. 4.

Referring back to FIG. 8, the parallel (SX) communication bus 60 between the main processor 28 and the interface processor 30 is shown at 60 in FIG. 7 and also in FIG. 8. As mentioned, a single processor of sufficient capacity could be used, if desired. The analog-to-digital converters 57A–57D for the CANH line 52, CANL line 53, Vpower line 54 and Vshield line 55 are also seen in FIG. 7.

The three push button switches shown at 15, 16 and 17 beneath the display 13 in FIG. 1 are shown in the upper left hand portion of FIG. 8, together with their associated connections to the main processor 30. In the lower left hand corner portion of FIG. 8, there is shown the twelve-position rotary switch 19 and its associated connections to the main processor 30. The outputs of the processor 30 which drive the LCD display 13 are designated respectively SEG0–SEG17 and COM-0 through COM-3.

Figure 2:
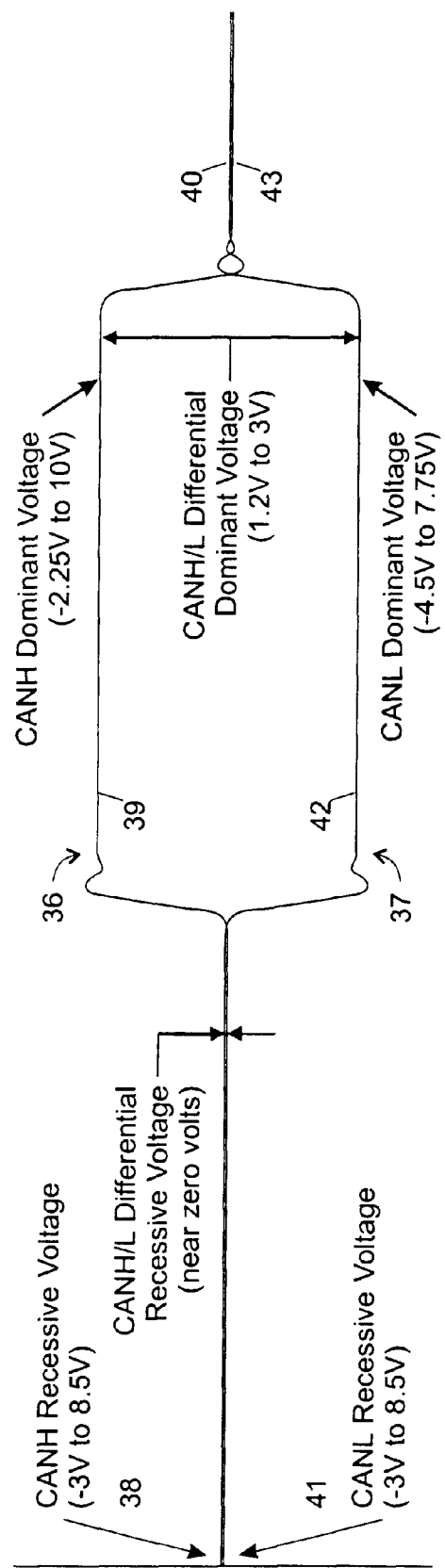
FIG. 2 is an illustration of representative CANH and CANL data signals and indicating some of the measurements taken by the instant system.

Referring now to FIG. 2, there are shown two waveforms designated generally respectively by reference numerals 36 and 37 and representing idealized voltage waveforms appearing on the CANH and CANL wires respectively. The CANH and CANL signals are two of four signals coupled through switch 25 to the diagnostic meter. Each of the CANH and CANL signals shown in FIG. 2 is comprised of a series of recessive bits and dominant bits, thus comprising a binary data transmission network. Thus, CANH signal 36 includes a first recessive bit 38, followed by a dominant bit 39, and then another recessive bit, a portion of which is shown at 40. Similarly, the CANL signal 37 is comprised of a first recessive bit 41, followed by a dominant bit 42 and then a second recessive bit 43. As is conventional the recessive bits for both CANH and CANL voltage signals coincide in time, as do the dominant bits.

For the DeviceNet protocol, specifications are set on all signal levels, but for purposes here, it will be observed that the difference between the CANH and CANL signals for a recessive bit is small. That is, the signal level of the recessive CANH bit 38 is very close to that of the recessive CANL bit 41. For the dominant bit, the difference between the CANH signal 39 and the CANL signal 42 is, according to system specifications, between 1.2 and 3.0 volts. The voltages shown in FIG. 2 are idealized signals appearing across a node. That is, the idealized signals shown in FIG. 2 are not affected by voltage drops in the lines extending between nodes or between the power source and an individual node. As used herein, the term "Node Common Voltage" is the voltage at the negative terminal of a node—that is, the node terminal connected to the corresponding negative terminal of the network power supply—relative to the voltage at the negative terminal of the network power supply, or other common point in the negative power feed line.

The recessive voltage is determined by a number of factors including the number of nodes on the network and the Node Common Voltage (caused by voltage drop in the power supply feed wire) of each node. The recessive voltage is nominally 2.5V with no Node Common Voltage variance. With respect to an individual node's Node Common Voltage, the recessive voltage can range from −3V to 8.5V in a properly designed network—that is, the network will operate reliably within this range. The dominant voltage is created by a transceiver's "pulling" the CANH line toward its 5V power supply (referenced to its associated Node Common Voltage) and the CANL line towards its associated Node Common Voltage.

Figure 3:
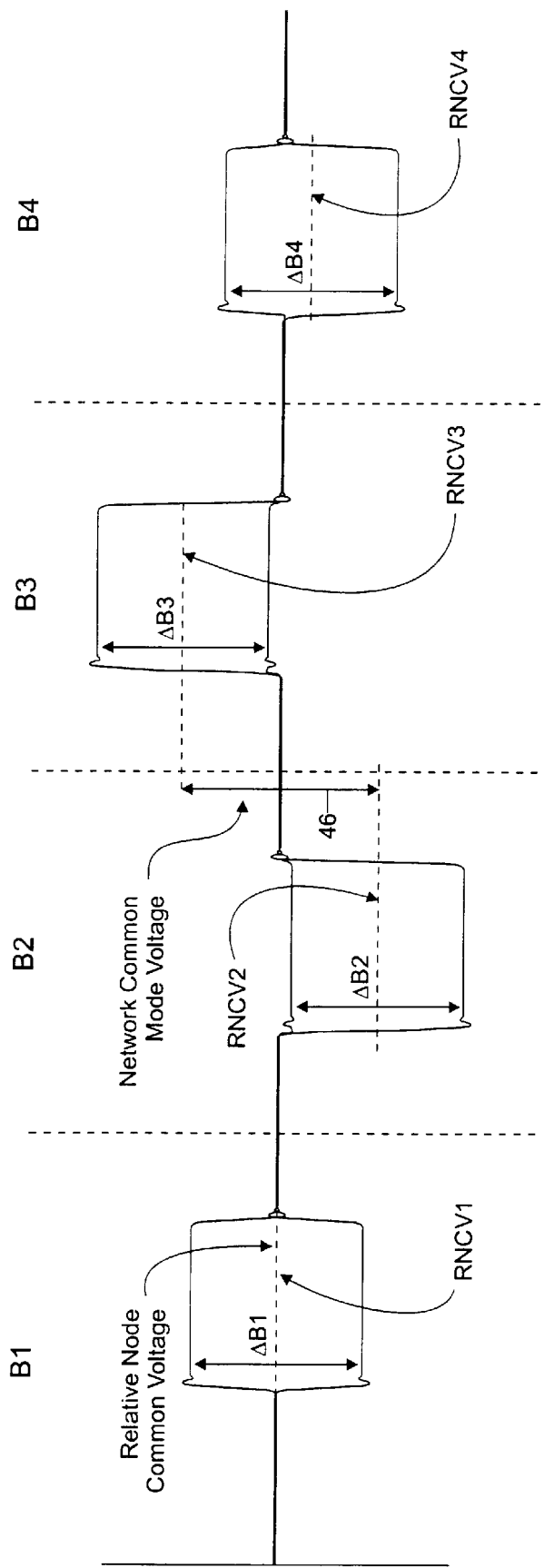
FIG. 3 is a diagram of data signals on the network for four different nodes, illustrating the definitions of Common Mode Voltage.

FIG. 3 illustrates signals for CANH and CANL as viewed from a common point in the network. It will be appreciated that if there are, by way of illustration and without limitation, twenty-four nodes (i.e., devices such as a robotic actuator, a visual display, a programmable logic controller, a personal computer, or the like), there will be differences in the terminal voltages appearing at each individual node from the other nodes because of variances in Node Common Voltage at the different nodes as well as voltage drops in the lines connecting the positive terminals of the nodes with the positive terminal of the system power supply. This normally does not interfere with proper system operation since the transceivers operate on voltage differences, not absolute levels, provided the levels are within system specifications. Thus, when viewing from a single point or port in a network, the voltages at the different nodes may differ when they are observed from a particular point. Yet, all are acceptable signals because the absolute differential signals which appear across any particular node (as distinguished from the observation point) are within system specifications. Thus, the transceivers for every node will still operate reliably.

Since each transceiver pulls the CANH signal towards its 5V power supply rails which are referenced to a node's Node Common Voltage, as defined above, and CANH and CANL lines are connected together by a terminating resistor, it is possible for both CANH and CANL voltages to move in the same direction (i.e., positive or negative) from the recessive voltage. The voltages illustrated in FIG. 3 are the CANH and CANL signals viewed from a single point during a dominant bit for four separate message frames and four different nodes. CAN signals are not necessarily symmetrical. The illustrated signals are all valid and likely to be observed in properly operating networks, providing the Common Mode Voltage is within prescribed limits.

In FIG. 3, there are shown four separate dominant bits designated respectively B1, B2, B3 and B4. Each of the bits B1–B4 appears in a different message frame sequence, separated by the vertical dashed lines. Each time sequence B1–B4 is in effect extracted from a complete message frame for an individual node, although only one dominant bit is shown in the drawing. Thus, the bit B1 is only a single dominant bit appearing out of a sequence of bits comprising a complete message frame and associated with one specific node. Similarly, the bit B2 is a single dominant bit appearing out of a sequence of bits comprising a message frame and associated with a different node, and so on. The purpose of the illustration of FIG. 3 and the explanation provided is to define the term "Common Mode Voltage" as it is used herein, and to be distinguished from "Node Common Voltage", defined above.

Each of the bits B1–B4 of FIG. 3 has a median or average voltage level indicated by the horizontal dashed lines associated with each of the illustrated bits and designated respectively RNCV1, RNCV2, RNCV3 and RNCV4. RNCV stands for the term "Relative Node Common Voltage." It is the voltage that is midway between the maximum voltage (CANH) and the minimum voltage (CANL) for the associated dominant bit. In other words, it is the difference between the Node Common Voltage for a specific node and a specific reference point in the network (typically the negative input terminal of the measuring device, i.e., the meter in this case).

The largest or maximum difference of the Node Common Voltage between any two nodes communicating on the network is the Common Mode Voltage of the network. That is, the data processor determines the Node Common Voltage for each node, determines the maximum and the minimum values and then determines the difference between the maximum and minimum values.

As discussed above and to be discussed further below, the network transceiver circuits in each node are responsive only to the differential input voltage, but the input voltage levels must meet system specifications for proper operation. An important parameter for the diagnostics of the present invention is the worst-case maximum Common Mode Voltage between any two nodes on the network under test. This voltage may be calculated by subtracting the lowest measured Node Common Voltage from the highest measured Node Common Voltage. However in the illustrated embodiment, it may be calculated by using Relative Node Common Voltage illustrated in FIG. 3 by the arrow 46 which is the difference between the maximum Relative Node Common Voltage RNCV3 and the minimum Relative Node Common Voltage RNCV2 for all nodes in the network.

Figure 3A:
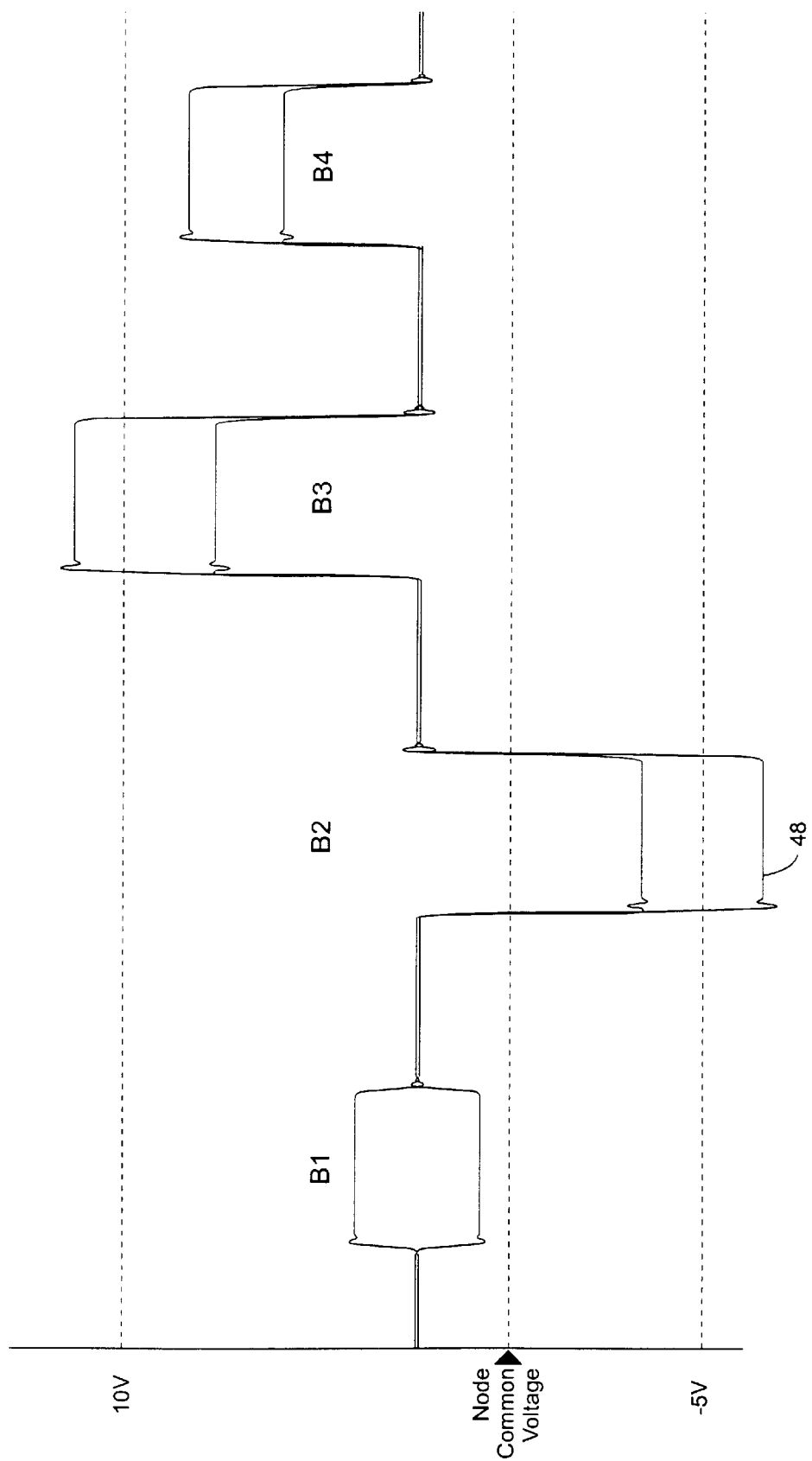
FIG. 3A is a diagram illustrating acceptable limits to the range of transceiver Common Mode Voltage.

Referring now to FIG. 3A, there are shown CANH and CANL signals for four separate bits, again designated respectively B1–B4, and each representative of a dominant bit in a different message frame appearing at the transceivers of four different nodes. As persons skilled in the art are aware, transceivers for CAN networks are circuits which decode the digital voltages on the network by measuring the differential between the CANH signal and the CANL signal. Transceivers are designed to operate with a limited range of input signal voltages. If the input signal voltage exceeds the transceiver's capabilities, dominant and recessive bits may be improperly decoded, resulting in communication errors. The CAN chips used in DeviceNet networks are designed to work with data signals in the range of 0–5V, and to operate with as much as + or −5V of Common Mode Voltage. This results in an acceptable input signal range from −5V to +10. These levels are relative to each respective Node Common Voltage.

Referring then to FIG. 3A, it can be seen that bit B1 is acceptable because the CANH and CANL levels for both recessive and dominant bits fall well within the acceptable range of −5V to +10V. Turning to bit B2, it is unacceptable because the CANL level for the dominant bit, designated by reference numeral 48, falls below the lower limit of the acceptable range. Similarly, bit B3 is unacceptable because the CANH voltage for the dominant bit exceeds the uppermost limit of the acceptable range. The final bit, B4, falls entirely within the range, and therefore is acceptable.

CAN Measurements Taken

The system of the present invention makes several direct and indirect (calculated) voltage measurements. They are identified below according to the time relative to each message frame during which the voltage is measured or a computation is made, or a measurement stored. In the case of DeviceNet sampling the RTR bit in each CAN frame avoids problems or ambiguities that may result in the initial portion of a communication in which multiple stations may be transmitting dominant bits concurrently.

(A) Measurements Taken During Each Frame Received

The data processor simultaneously detects and records CANH and CANL voltages "live," maximum and minimum, during one dominant bit of each message frame. In the case of DeviceNet, the RTR bit is always dominant (i.e., the binary bit is always a logic "zero").

(B) Measurements Taken and Calculations Made After Each Frame Received

The system reads the CANH and CANL dominant voltage measurements captured during the received frame, and it copies or writes CANH and CANL dominant measurements into the database. The previous "live" values are overwritten so that the "live" values in the database which will be displayed are the most current measurements.

The system updates the minimum and maximum CANH and CANL dominant bit measurements in the database, if appropriate. The maximum and minimum values of CANH and CANL voltages stored in memory are overwritten if (i.e., the new measurement replaces the former measurement) the current value for each parameter is greater or less than the previous value stored in the database respectively.

The processor calculates the CANH/L dominant differential voltage. This is done by subtracting the CANL value from the CANH value for an associated bit and message. The processor copies the CANH/L dominant differential measurement into the database. The previous "live" value is overwritten upon each calculation. The processor updates the minimum and maximum CANH/L dominant differential measurement in the database, if appropriate. The maximum (MAX) and minimum (MIN) values are overwritten if the current value is greater than or less than the value then stored in the data base.

The main processor calculates the Relative Node Common Voltage by adding one-half of the CANH/L differential voltage measured to the CANL voltage (the Node Common Voltage is the mid-point between the CANH and CANL voltages for any given dominant bit). The main processor updates the highest and lowest Relative Node Common Voltage in the database. The highest and lowest values of Relative Node Common Voltage are overwritten if the current value is greater or less than the previous values stored in the database respectively.

After each message frame is received, the main processor also calculates the network Common Mode Voltage by subtracting the lowest Relative Node Common Voltage in the database from the highest Relative Node Common Voltage. The previously stored value is overwritten, if the new value is greater than the previously stored value. The Common Mode Voltage measurement always reflect the worst-case or maximum difference between all Relative Node Common Voltages measured since the meter was turned on or re-set by the operator.

(C) Measurements Taken Between Frame and Calculations Made

Between message frames, when the bus is in an idle condition, the main processor receives or captures CANH and CANL voltages. The bus is recessive or idle. The data processor then copies the CANH and CANL recessive measurements into the database. The previous "live" (i.e., real time as contrasted with derived or computed) values are overwritten. The main data processor then updates the minimum and maximum CANH and CANL recessive measurements in the database, if appropriate. The maximum and minimum values of CANH and CANL recessive are overwritten if the current value is greater or less than the previous values in the database respectively.

The main data processor calculates the CANH/L recessive differential voltage by subtracting the CANL value from the CANH value. This calculated value is then copied into the database. The previous "live" value is overwritten (i.e., stored in the same memory address as the previous value had been stored). The main data processor then updates the minimum and maximum CANH/L recessive differential measurements in the database, if appropriate. The maximum and minimum values are overwritten by the data processor if the current value is greater or less than the previous values stored in the database.

In summary, there are a total of nineteen CAN voltage measurements recorded in the database of the system:

1. "Live" CANH recessive voltage (most recent measurement);
2. Maximum CANH recessive voltage;
3. Minimum CANH recessive voltage;
4. "Live" CANL recessive voltage (most recent measurement);
5. Maximum CANL recessive voltage;
6. Minimum CANL recessive voltage;
7. "Live" CANH/L differential recessive voltage (most recent measurement);
8. Maximum CANH/L differential recessive voltage;
9. Minimum CANH/L differential recessive voltage;
10. "Live" CANH dominant voltage (most recent measurement);
11. Maximum CANH dominant voltage;
12. Minimum CANH dominant voltage;
13. "Live" CANL dominant voltage (most recent measurement);
14. Maximum CANL dominant voltage;
15. Minimum CANL dominant voltage;
16. "Live" CANH/L differential dominant voltage (most recent measurement);
17. Maximum CANH/L differential dominant voltage;
18. Minimum CANH/L differential dominant voltage;
19. Network Common Mode voltage.

(D) Other Measurements Taken

Using conventional software, hardware or a combination of means thereof, the meter measures communication errors and network traffic statistics for the entire network and for each station. As with the electrical measurements described in detail, the meter records "live", minimum and maximum values of these measurements.

In summary, the meter of the present invention measures and records, from the observation point of the meter connection and for each node on the network, a series of signals, including the CANH recessive value (displayed at Position 8 of the rotary switch 19), the CANH dominant value (Position 9), the CANL recessive value (Position 10) and the CANL dominant value (Position 11). The minimum and maximum values of these signals which have been recorded and overwritten during testing since the last reset of the meter or since the meter was turned on it also may be viewed by sequentially pressing the switch 15 (sometimes referred to as the incrementing switch) to the present minimum, maximum, and current or "live" values in sequence, each being displayed in value and indicated as such on the display 13. The meter of the present invention constantly measures and records statistics related to communication errors (Position 1) and network traffic (Position 2). The minimum and maximum values of these measurements which have been recorded and overwritten since the last reset of the meter or since the meter was turned on may also be viewed by sequentially pressing the switch 15 to present minimum, maximum and current or "live" values in sequence. This information alone is valuable in diagnosing the reliability or acceptability of a functioning network, but it has been found that an even more significant factor is the calculation, from the stored values, of the Common Mode Voltage (Position 5) which is defined as a worst-case maximum between any two nodes on the network, i.e., voltage for every node in the network as represented by the arrow 46 in FIG. 3.

If a particular measurement under investigation is found to be within desired operating specifications, the meter signifies a "happy" face indicated by the symbol 48 on the display 12 in FIG. 1. Similarly, if a particular measurement under investigation is not within the desired operating specifications, but is also not within the unacceptable specifications, a "neutral" face is illuminated as indicated by reference number 49 in FIG. 1. Third, if a particular measurement under investigation is found to be unacceptable, the system illuminates a "sad" face symbol indicated at 50 in FIG. 1.

Figure 9:
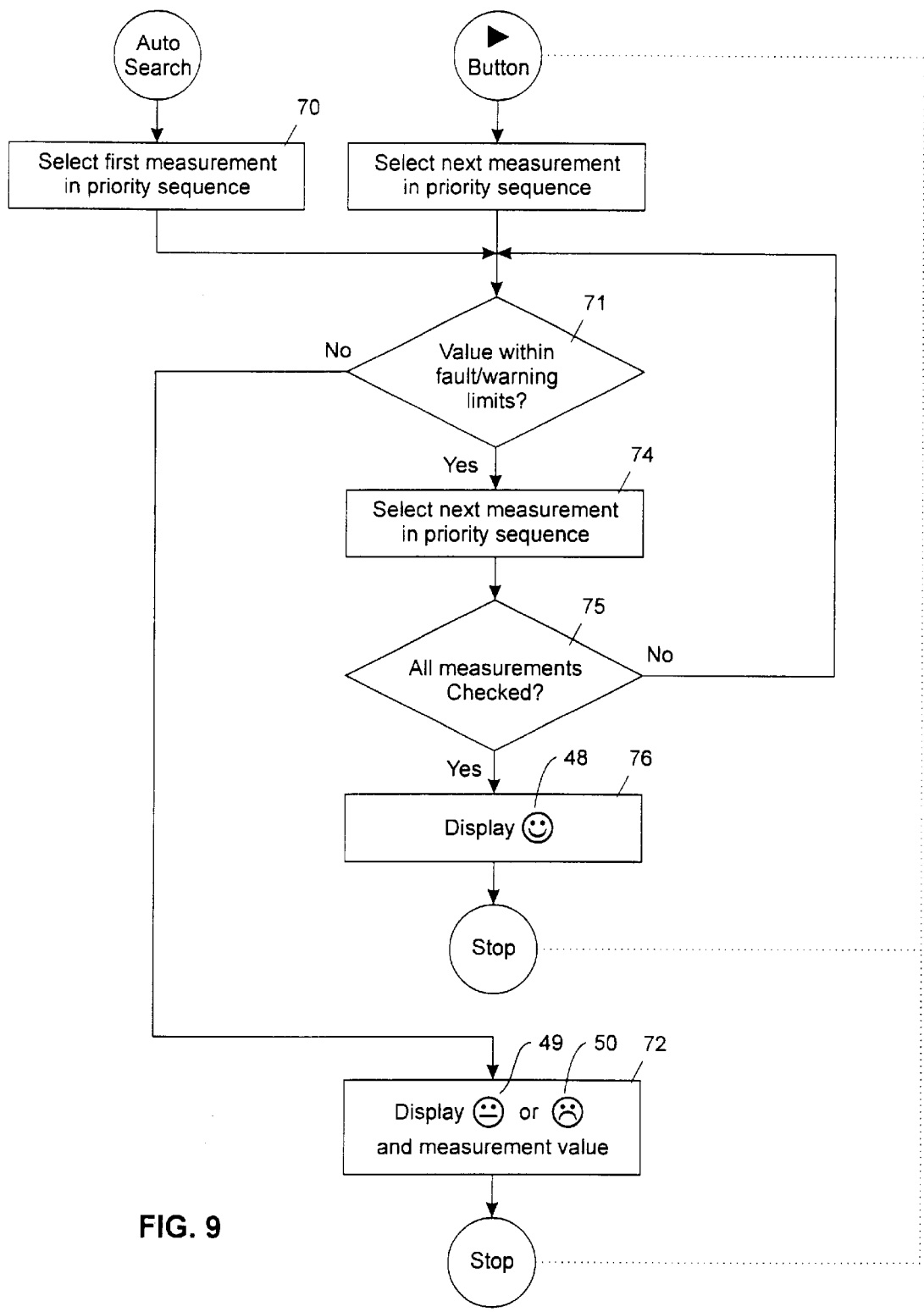
FIG. 9 is a flow chart showing the operation of the interface processor in the Auto Search mode.

Turning now to FIG. 9, there is a shown a flow chart for the "Auto Search" mode of operation which is entered when the operator turns the rotary switch 19 to the upper or twelve o'clock position, as seen in FIG. 1. The operational program for the "Auto Search" mode may be stored in the interface processor 30. The processor 30 selects the first measurement in the priority sequence, as indicated by block 70 in FIG. 9. The processor then determines, in block 71, whether that measurement is within acceptable limits or whether is it unacceptable or whether it is in the intermediate or "neutral" range and is, therefore, conditionally acceptable. If the signal value is conditionally acceptable or unacceptable, the program proceeds to block 72 and displays either the conditionally acceptable symbol 49 or the unacceptable symbol 50 respectively. If, in block 71, the processor 30 determines that the value is acceptable, the processor proceeds to select the next measurement in the priority sequence as indicated in block 74 without displaying anything. After all the indicated measurements are checked in block 75, if all the values are within acceptable range, processor displays the acceptable symbol 48, as indicated in block 76 and stops for that cycle. If, in decision block 75, any one or more of the measurements is unacceptable, the program proceeds back to the beginning of block 71 to make the same determinations already indicated.

Having thus disclosed in detail one embodiment of the invention, persons skilled in the art will be able to modify certain of the circuitry which has been disclosed and to substitute equivalent elements for those described while continuing to practice the principle of the invention; and it is therefore intended that all such modifications and substitutions be covered as they are embraced within the spirit and scope of the appended claims.

What is claimed is:

1. A test meter for a data communication network having first and second data lines, data bits on said network being represented by signals on said data lines including a relatively high signal on one of said lines and relatively low signal on the other of said lines and including dominant and recessive bits occurring in succession comprising:

an input connector for connecting to said network;

a transceiver receiving data on said data lines and generating an output stream of data signals in accordance with a protocol of said network;

a data processor receiving the output stream of said transceiver and processing the same according to a stored program;

at least first and second analog-to-digital converters respectively having controlled sampling times in timed relation with each other and coupled respectively to said input connector for generating sampled digital signal representations of the data on each of said data lines of said network respectively, said data processor coupled to receive the output signals of said analog-to-digital converters; and a visual display having a numeric display and indicia display for representing acceptable or unacceptable conditions being measured by said meter;

said data processor being programmed to enter an auto search mode upon actuation by a user to cycle through predetermined network operating parameters incorporating the signals on said first and second data lines, said data processor storing data representative of an acceptable state of conditions and an unacceptable state of conditions for each network parameter being measured, said data processor controlling the sampling of said analog-to-digital converters and comparing the measured data from said analog-to-digital converters to associated data of said stored data and actuating said indicia display to evidence one of said acceptable and unacceptable conditions for selected ones of said network parameters, and actuating said numeric display to indicate the value thereof.

2. The apparatus of claim 1 wherein said network incorporates DeviceNet specifications having CANH signal on said first data line and CANL signal on said second data line; and characterized in said network parameters measured and stored by said data processor include: (a) the values of said CANH signal for a dominant bit; (b) the value of said CANH signal for a recessive bit; (c) the value of said CANL signal for a dominant bit; and (d) the value of said CANL signal for a recessive bit.

3. The apparatus of claim 2 wherein said system parameters measured and stored by said data processor further include: (e) a differential value between said CANH and said CANL signals at a pre-determined sampling time for a dominant bit; and (f) a differential value between said CANH and said CANL at a pre-determined sampling time for a recessive bit, said data processor being programmed to compute said differential values from stored measurements of said CANH and CANL signals.

4. The apparatus of claim 3 wherein said data processor upon initial action by a user cycles sequentially through each of said measurements or calculations for said network parameters and actuates said display to display only unacceptable results, and further including a switch actuable by a user to sequence through each of said measured or calculated parameters and to continue through said sequence when said parameters are determined to be within acceptable limits, said data processor stopping said sequencing when a network parameter is determined to be unacceptable and actuating said indicia display to indicate an unacceptable condition.

5. The meter of claim 1 wherein said data processor further includes data representative of threshold values of each of said CANH and CANL signals which define ranges of acceptable, unacceptable and marginal values for said network parameters, and wherein said indicia display includes a visual indicator conveying that an associated signal is within said neutral range.

6. The meter of claim 5 wherein said visual indicator of acceptable measured levels is a smiling face.

7. The meter of claim 6 wherein said visual indicator of unacceptable measured levels is a sad face.

8. The meter of claim 7 wherein said visual indicator of marginal measured levels is a neutral face.

9. The apparatus of claim 1 wherein said network protocol is DeviceNet protocol and transmits binary messages in frames having an RTR bit, and wherein said data processor measures CANH and CANL by sampling said RTR bit in each data frame to avoid ambiguity among competing devices on said network at the start of a message frame, and wherein each sample is taken at the normal MAC bit sampling time under DeviceNet specifications.

10. The apparatus of claim 1 further including a manual incrementing switch actuable by a user, said data processor responsive to positions of said switch to increment said display to the next succeeding signal parameter, and actuating said display to identify the parameter being displayed and its value.

11. The meter of claim 1 wherein said network employs DeviceNet protocol and said network operating parameters include CANH for a dominant bit, CANH for a recessive bit, CANL for a dominant bit and CANL for a recessive bit for each data frame and wherein said data processor stores the most recent value for each of said parameters; and wherein said incrementing switch has a separate position to display each of said recorded network parameters.

12. The apparatus of claim 11 wherein said network parameters further include a differential voltage value of CANH/CANL for a dominant bit and a differential voltage value of CANH/CANL for a recessive bit, said incrementing switch having a separate position for each of said differential values.

13. The apparatus of claim 12 wherein said network includes a shield connection and a bus power line coupled to said connector when said connector is connected to said network and wherein said data processor measures and stores values for bus power voltage and shield voltage and display to displays said values when an operator actuates said rotary switch to an associated position.

14. The meter of claim 13 wherein said data processor further computes and stores maximum and minimum values for said network parameters, said data processor overwriting previously stored maximum and minimum values for said network parameters when said stored values are exceeded by current values.

15. The meter of claim 14 wherein data processor is responsive to switch to display current or live values of said network parameter, a stored maximum value and a stored minimum value upon successive actuations of said incrementing switch.

16. The meter of claim 1 wherein said data processor computes the Relative Node Common Voltage from the stored database and determines and stores the maximum difference between any two stored values for said Relative Node Common Voltage for said network said difference being Common Mode Voltage for said network, said data processor actuating said display to display said common Mode Voltage when said incrementing switch is set to a predetermined position by a user.

17. In a test meter for a data communication network having first and second data lines, data bits on said network being represented by signals on said data lines in a serial data stream including a relatively high signal on one of said lines and a relatively low signal on the other of said lines and including dominant and recessive bits comprising:

a transceiver receiving data on said data lines and generating an output stream of data signals in accordance with a protocol of said network;

a data processor receiving the output stream of said transceiver and processing the same according to a stored program;

first and second analog-to-digital converters respectively having controlled sampling times synchronized with the data in said serial data stream and coupled respectively to said first and second data lines for generating simultaneously sampled digital signal representations of the data signals on each of said data lines of said network respectively with each other, said data processor coupled to receive the output signals of said analog-to-digital converters; and a visual display for representing acceptable or unacceptable network conditions being measured by said meter;

said data processor being programmed to cycle through predetermined network operating parameters incorporating the signals on said first and second data lines, said data processor storing data representative of an acceptable state of data conditions and an unacceptable state of data conditions for said network parameters being measured, said data processor controlling the sampling of said analog-to-digital converters to be coincidental and comparing the measured data from said analog-to-digital converters to associated data of said stored data and actuating said indicia display to evidence one of said acceptable and unacceptable conditions of said network parameters.

\* \* \* \* \*